United States Patent [19]

Bruel et al.

[11] 4,452,644
[45] Jun. 5, 1984

[54] PROCESS FOR DOPING SEMICONDUCTORS

[75] Inventors: Michel Bruel, Veurey; Philippe Spinelli, La Tronche, both of France

[73] Assignee: Commissariat a l'Energie Atomique, Paris, France

[21] Appl. No.: 380,709

[22] Filed: May 21, 1982

[30] Foreign Application Priority Data

May 21, 1981 [FR] France .................................. 81 10132

[51] Int. Cl.$^3$ .................. H01L 21/265; H01L 21/324; H01L 21/263
[52] U.S. Cl. .................................... 148/1.5; 29/576 B; 148/187; 250/492.1; 357/91
[58] Field of Search ............... 148/1.5, 187; 29/576 B; 250/492.1; 357/91

[56] References Cited

U.S. PATENT DOCUMENTS 4,370,176  1/1983  Bruel ..................................... 148/1.5

FOREIGN PATENT DOCUMENTS 1402998 of 0000 United Kingdom .

OTHER PUBLICATIONS

Wang et al., Thin Solid Films, 74, (1980), 239.

Shannon in Inst. Phys. Conf. Ser. No. #28, 1976, Chapter I, pp. 37–43.

Japanese Journal Applied Physics Supplement, vol. 16, No. 16–1, 1977.

IBM Technical Disclosure Bulletin, col. 23, No. 1, Jun. 1980.

IBM Technical Disclosure Bulletin, vol. 22, No. 9, Feb. 1980.

Nuclear Instruments and Methods, vol. 182/3, Apr.-/May 1981, Part I.

*Primary Examiner*—Upendra Roy
*Attorney, Agent, or Firm*—Oblon, Fisher, Spivak, McClelland & Maier

[57] ABSTRACT

The present invention relates to a process for doping semiconductors, comprising the steps of: effecting implantation by recoil consisting in depositing on the surface of the substrate a layer of material containing dopant particles and in bombarding said layer by means of a beam of bombarding particles, which are in particular non-dopant, so as to cause the dopant particles to penetrate in the substrate; eliminating the layer of material deposited on the surface of the substrate; and effecting transitory annealing. The invention is applicable to the manufacture of solar cells.

8 Claims, 3 Drawing Figures

PROCESS FOR DOPING SEMICONDUCTORS

BACKGROUND OF THE INVENTION

The present invention relates to a process for doping semiconductors.

It is known that doping of a semiconductor consists in implanting foreign particles, or impurities in a substrate constituted by the semiconductor to be doped, and in rendering these impurities electrically active. The addition of impurities in a semiconductor enables the physical properties of said semiconductor, and particularly its electrical properties, to be modified.

Several processes for doping semiconductors are known, such as for example ion implantation, diffusion, epitaxial growth, alloying technique, etc. These different types of doping processes present certain drawbacks and, in particular, that of not being usable universally.

In fact, such or such process is used depending on the dopant particles used and/or the material constituting the semiconductor to be doped. Moreover, these different processes are more or less complex to carry out.

BRIEF SUMMARY OF THE INVENTION

It is therefore an object of the present invention to provide a process for doping semiconductors which overcomes these drawbacks and which, in particular, is carried out simply and universally.

This process for doping semiconductors, according to the invention, comprises the following successive steps of:
  effecting an implantation by recoil of the dopant particles in the substrate, which consists in depositing on the surface of the substrate a layer of material containing dopant particles, and in bombarding said layer by means of a beam of bombarding particles, so as to cause the dopant particles to penetrate in the substrate;
  eliminating the layer of material deposited on the surface of the substrate;
  effecting transitory annealing, which consists in bringing to the surface, or to the level of the first implanted layers, for a very short length of time, an energy density such that very high temperatures are reached, so as to produce a local liquefaction of the first layers of the substrate.

According to another feature of the invention, the various steps of the process are carried out in the same enclosure in vacuo.

According to a preferred embodiment of the invention, the beam of bombarding particles is constituted by a beam of rare gas ions.

The advantage mentioned previously are indeed offered by the present invention.

In fact, it is known to deposit on the surface of any body constituting the substrate a thin layer of any body or compound constituting the material containing the dopant particles. Similarly, it is simple to produce and use a beam of rare gas ions.

Moreover, the fact of using a very intense ion beam allows a very fast implantation by recoil, and the fact of using a transitory annealing, which is a rapid step of the process, enables the doping of semiconductors of all types to be obtained at a very high rate.

For still increasing the rate of the doping of semiconductors, the bombardment of the layer of material containing the doping particles deposited on the surface of the substrate, the elimination of the doping layer, after penetration of the doping particles into the substrate, and the transitory annealing are performed at the same time by means of the same beam of particles.

The use of the same beam of particles and in particular an argon ion beam makes it possible to simplify the equipment necessary for performing the doping of semiconductors.

According to another preferred embodiment of the invention, transitory annealing can be carried out either in the liquid phase, or in the solid phase.

DETAILED DESCRIPTION OF THE PREFERRED EMBODIMENTS

The invention will be more readily understood on reading the following description with reference to the accompanying drawings, in which:

FIG. 1 shows two curves indicating the profile of an implantation by recoil (number of atoms implanted in the substrate per cubic centimeter, expressed in power of ten, as a function of the depth of implantation in the substrate, expressed in Ångströms), curve 1 representing the profile of the implantation before transitory annealing, curve 2 the profile of the implantation after transitory annealing.

Figure 1:
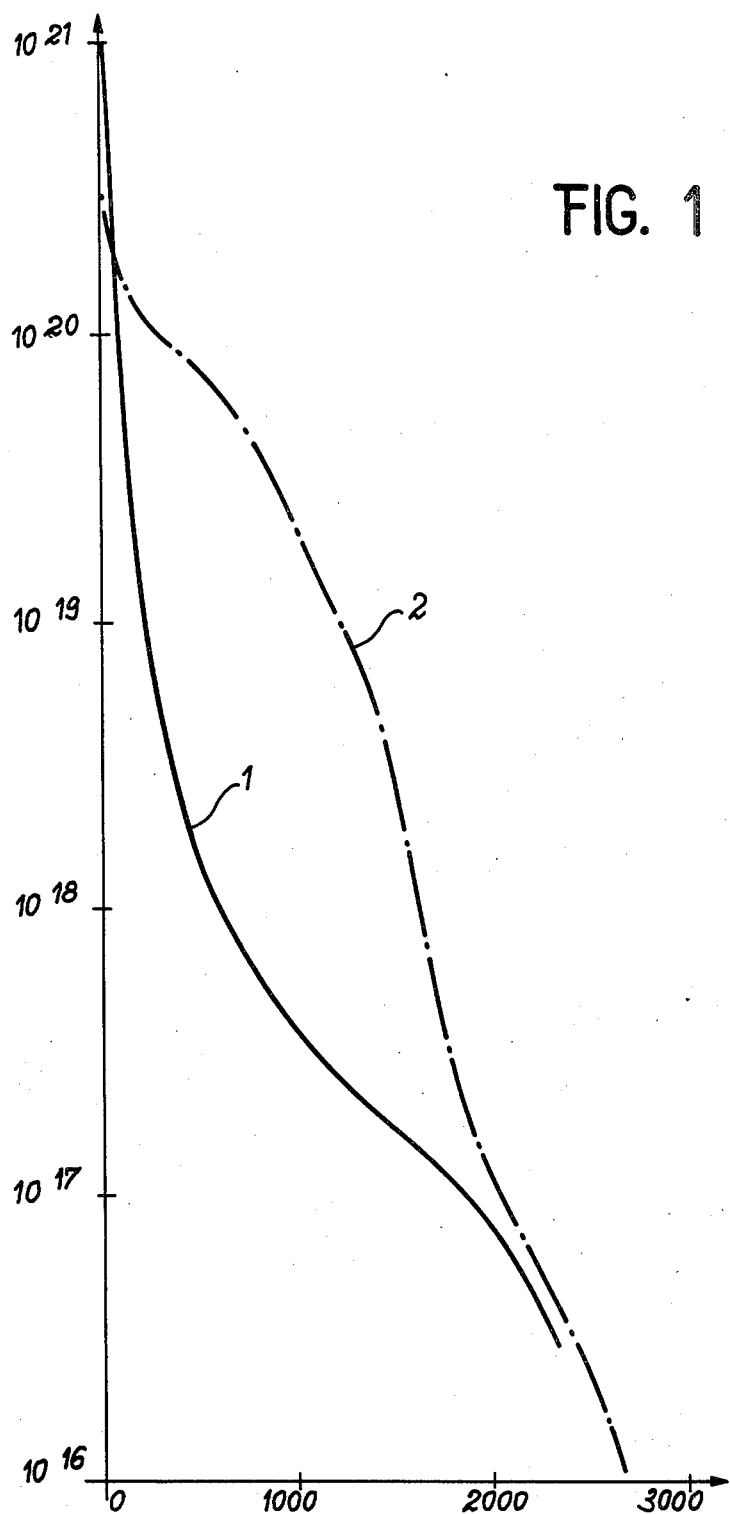

The process of doping semiconductors, according to the invention, consists in the following different steps which will now be described.

The first step is an implantation by recoil which consists in implanting the dopant particles (atoms or ions) in a substrate constituted by the semiconductor to be doped. The dopant particles are contained in a layer of material deposited on the surface of the substrate, preferably by evaporation. The energy necessary for the particles to penetrate into the substrate, included between a few electron-volts and several kilo-electron-volts, comes from a transfer of energy between a beam of bombarding particles, which in particular are non-dopant, which bombards the layer deposited on the substrate, and the dopant particles contained in said layer.

By using a very intense beam of ions of rare gas, preferably argon, implantation by recoil constitutes a fast step of the process.

The second step of the process consists in eliminating, after implantation, the layer of material deposited on the surface of the substrate. The elimination of this layer may be effected either by sublimation in vacuo, by chemical attack, or by ionic atomization. Ionic atomization may be carried out with the aid of an ion beam which may have the same constitution as the ion beam used for implantation by recoil. This ion beam is preferably a beam of argon ions. Of course, the energies conveyed by these beams may be different. In fact, implantation by recoil requires greater energies than ionic atomization.

Preferably, the implantation by recoil and the elimination of the doping layer are performed at the same time. In this case, the elimination of the layer takes place by using a beam of particles, which is the same as that used for implantation by recoil. In this case, this beam of particles is an argon ion beam transporting the same energy and having the same intensity as that used for implantation by recoil. The power of the beam produces a temperature rise in the doping layer, which sublimates or evaporates, thus realising the second stage of the process.

The third step consists in effecting a transitory annealing, allowing the positioning of the dopant particles in the substitutional of the crystal lattice of the substrate, and the rearrangement of this lattice which was disturbed during penetration of the dopant particles in the substrate. This transitory annealing consists in bringing to the surface or to the level of the first implanted layers, for a very short length fo time, an energy density such that very high temperatures are reached so as to produce a local liquefaction of the first layers of the substrate. Thus, this transitory annealing can take place either in the liquide phase, or in the solid phase. This transitory annealing may be carried out with the aid of a pulsed electron beam or a laser shot.

Preferably the transitory annealing is performed simultaneously with the ion implantation by recoil and the eliminating of the doping layer. In this case, the transitory annealing is performed by means of the same beam of particles as that used for implantation by recoil and for the elimination of the layer of material deposited on the substrate. This beam of particles is in particular an argon ion beam of the same energy and intensity as that used for the implantation by recoil.

In this preferred embodiment of the invention, the different stages of the process are performed simultaneously during irradiation by the beam of ions. The three stages are indistinguishable and temporarily overlap.

The different steps of the process, whatever their embodiment, may be carried out in the same enclosure in vacuo.

As the techniques used for depositing the layer of dopant material then for eliminating same are known, a more detailed description thereof will not be given.

This process of doping according to the invention was carried out with a layer of material containing dopant particles, of antimony, and a substrate of silicon. Implantation by recoil was carried out by means of a beam of argon particles carrying an energy of 100 keV. The deposit of the layer of dopant material was carried out as described hereinabove, as well as elimination thereof. By effecting elimination by ionic atomization with the aid of a beam of argon particles, it suffices to use a beam carrying an energy of 500 eV to 1 keV, i.e. about 100 to 200 times less energetic than for implantation by recoil. For transitory annealing by laser shot, a ruby laser carrying 0.3 Joule of energy in pulse form for 15 nanoseconds, was used. Transitory annealing by electron pulse was effected with the aid of machines of type SPI 300 and SPI 5000 marketed by SPIRE (U.S.A.) enabling an energy density of the order of 1 J/cm$^2$ to be supplied.

Detailed studies of this doping process have shown that the association of implantation by recoil with transitory annealing leads to fast and effective doping of semiconductors.

In fact, with reference to FIG. 1, and in particular to curve 1 representing the profile of an implantation by recoil, before transitory annealing, it is observed that the surface concentration of the dopant particles is very high, generally 100 times higher than the concentration obtained by a conventional method of implantation. Curve 2 represents what curve 1 becomes, i.e. implantation by recoil after transistory annealing. The profiles of the implantation by recoil have been plotted on one of the isotopes of antimony implanted in silicon. Transistory annealing was carried out with the aid of a pulsed electron beam.

The fact of using transitory annealing enables the particles of antimony to penetrate in the silicon in depth. Moreover, the fact of using such annealing does not cause the antimony particles, which were introduced by implantation by recoil, to re-emerge. In fact, by integration of the concentration profile and by direct measurement due to analysis by neutron activation, it has been verified on the profiles plotted (curves 1 and 2) that, to within 15%, the number of antimony particles per cubic centimeter introduced into the substrate is the same as the number of dopant particles present in the silicon substrate, after transitory annealing. On the other hand, if conventional annealing is used, i.e. the fact of taking the implanted substrate to high temperature for a more or less long period of time, it is observed that 80 to 90% of the implanted particles re-emerge from the substrate, this being connected with the high concentration of the dopant particles implanted, present on the surface. Moreover, the electrical qualities of such a semiconductor (implantation by recoil, followed by conventional annealing) are considerably inferior to those obtained for the same annealing, with conventional implantation. On the other hand, the electrical qualities obtained for a doped semiconductor according to the invention (implantation by recoil followed by transistory annealing) are the same as those obtained with conventional doping (conventional ion implantation and conventional annealing); in particular, the resistivities are equal, to within the precision of the measurement (about 50 Ohms per square for $5.10^{14}$ ions of antimony, implanted by recoil per cm$^2$).

Other studies have shown that the presence of a rare gas in the substrate, due to the implantation by recoil with a beam of rare gas ions, and particularly argon, does not explain the anomalies obtained when employing conventional annealing.

Moreover, the doping process according to the invention has the advantage of presenting, under certain conditions, a range of stationary state as far as the effectiveness of recoil is concerned, i.e. the number of dopant particles penetrating in the substrate per bombarding particles. This effectiveness generally depends on the energy brought by the bombarding particles and on the thickness of the layer of material deposited on the substrate, but zones exist where this effectiveness is stationary, i.e. the number of dopant particles penetrating in the substrate depends only on the number of incident bombarding particles. The number of bombarding particles being controllable simply and with precision renders the use of the process easy to master. It should be noted that the effectiveness of the recoil may be greater than one and may reach a value equal to three.

Figure 2:
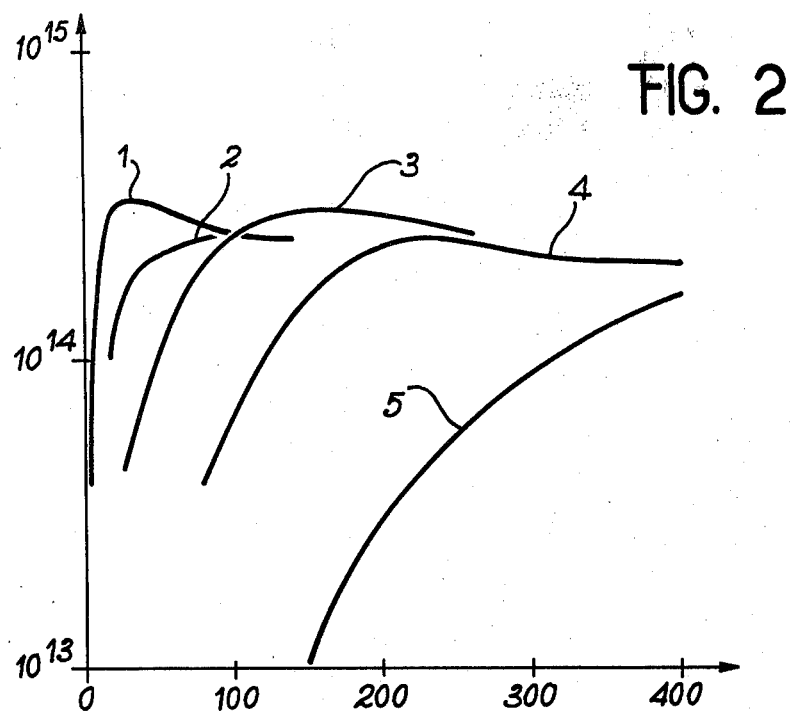
FIG. 2 shows five curves indicating the effectiveness of the recoil (number of particles penetrating in the substrate) as a function of the energy of the bombarding particles (expressed in kilo-electron-volt) for different thicknesses of the layer deposited on the substrate.
Figure 3:
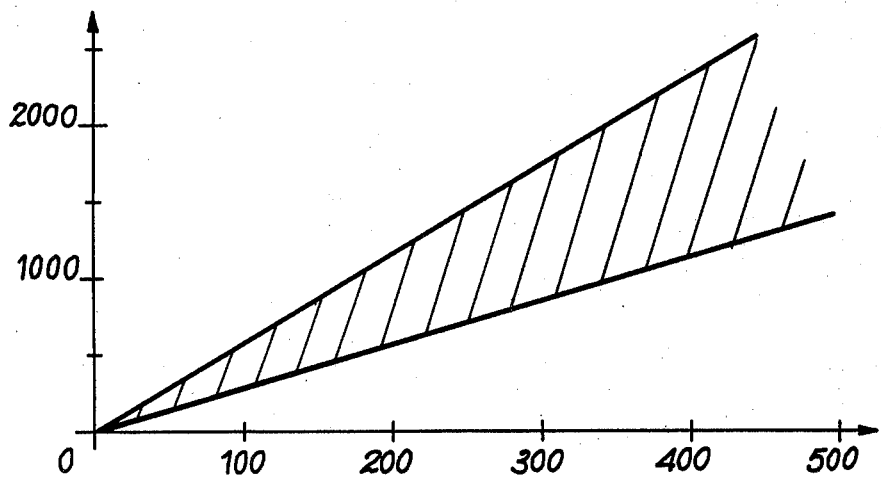
FIG. 3 represents a range of stationary effectiveness of the implantation by recoil of particles of antimony in a substrate of silicon with the aid of a beam of argon particles (thickness of the layer of antimony expressed Ångströms as a function of the energy of the incident particles of argon expressed in kilo-electron-volt).

The range of stationary state is illustrated with the aid of the five curves in FIG. 2 and the curve of FIG. 3.

FIG. 2 shows the effectiveness of the recoil as a function of the energy of the bombarding particles. The dopant particles are constituted by antimony, the substrate is made of silicon and the bombarding particles are constituted by argon ions. The argon ion beam used for the five curves is the same and contains $3 \times 10^{14}$ ions/cm$^2$.

Curve 1 corresponds to a layer of antimony deposited on the substrate of 150 Å thickness, curve 2 to a layer of 300 Å, curve 3 to a layer of 620 Å, curve 4 to a layer of 1200 Å, and curve 5 to a layer of 2500 Å. With the aid of these five curves, it is observed that the number of particles implanted by recoil for a given thickness and from a given energy, tends towards a value of $6 \times 10^{14}$/cm$^2$, which corresponds to double the number of incident argon particles. Of course, this value is more or less quickly reached depending on the thickness of the layer deposited and the necessary energy is more or less high. This shows that zones exist (function of the energy of the incident particles and the thickness) where this effectiveness is stationary.

This result is clearly illustrated in FIG. 3. The range where the effectiveness of the recoil is stationary is represented by the hatched zone. This range corresponds to an implantation of particles of antimony in silicon, with the aid of a beam of argon ions. This curve shows that the effectiveness of the recoil varies little when the thickness of the layer deposited on the substrate and/or the energy of the incident particles vary considerably. In this range, the effectiveness of the recoil is of the order of two.

It will be noted that this range of stationary effectiveness is not peculiar to the process using argon and antimony for doping the silicon. The existence and size of this range are connected with the distribution between electron deceleration and nuclear deceleration produced in the deposited layer. The fact that the effectiveness is stationary is promoted by a predominance of nuclear deceleration. This range of stationary effectiveness is different when one of the following three parameters: nature of the layer deposited, nature of the bombarding particle or ion, nature of the substrate, is modified.

A performance example of the doping process according to the invention will now be described in which the different stages of the process are performed simultaneously. In this example, the substrate to be doped is of silicon and the doping material is antimony.

A thin antimony film of approximate thickness 600 Å is firstly deposited on a silicon wafer by vacuum evaporation. This silicon wafer in a vacuum enclosure is then exposed to the action of a beam of argon ions, each transporting an energy of approximately 200 keV and an intensity of approximately 400 μA. The focusing of the ion beam on the wafer takes place, for example, on a surface smaller than 0.25 cm$^2$. Bombardment of the wafer by the ion beam takes place by scanning all or part of the surface thereof.

The bombardment of the wafer is accompanied by a temperature rise. Thermal equilibrium is reached after a few seconds. It is then found that the antimony deposit has completely disappeared and that the irradiated part of the wafer has a crystalline appearance.

Resistivity measurements of the semiconductor associated with analyses by neutron activation confirm that there has indeed been a doping of the silicon substrate by antimony.

The aforementioned example can be interpreted in the following manner. During the first instance of the bombardment of the wafer by the argon beam, the assembly constituted by the silicon wafer and the antimony deposit has not had time to heat. During this time, the deposited thin film is present. Thus, the effect of the ion beam is to make antimony ions or atomes penetrate by recoil into the silicon substrate.

As soon as the temperature rises under the action of the ion beam to about 500° C., the thin antimony film sublimates or evaporates, which leads to its disappearance.

The ion beam then continues to supply energy and consequently heat the wafer. The latter is then in a temperature range in which the surface layers impaired by the ion implantation can undergo epitaxy from the deep layers. This stage corresponding to the transitory annealing makes it possible to rearrange the crystal lattice of the semiconductor, as well as to place the antimony ions or atoms in an active site.

This doping process which is simple and fast to carry out, may be applied in the large-scale to the manufacture of solar cells based on silicon or another semiconductor.

What is claimed is:

1. A process for doping semiconductors consisting in implanting dopant particles in a substrate an in rendering them electrically active, so as to modify the physical properties of the substrate, comprising the steps of:

effecting an implantation by recoil of the dopant particles in the substrate, which consists in depositing on the surface of the substrate a layer of material containing dopant particles, and in bombarding said layer by means of a beam of bombarding particles, so as to cause the dopant particles to penetrate in the substrate;

eliminating the layer of material deposited on the surface of the substrate;

effecting transitory annealing, which consists in bringing to the surface, or to the level of the first implanted layers, for a very short length of time, an energy density such that very high temperatures are reached, so as to produce a local liquefaction of the first layers of the substrate, wherein the bombardment of the layer of material containing the doping particles deposited on the surface of the substrate, the elimination of the doping layer, after penetration of the doping particles into the substrate, and the transitory annealing are performed at the same time by means of the same beam of particles.

2. A doping process according to claim 1, wherein the layer of material containing the dopant particles is made by evaporation.

3. A doping process according to claim 1, wherein the beam of bombarding particles is constituted by a beam of rare gas ions.

4. A doping process according to claim 1, wherein the transitory annealing is performed in the liquid phase.

5. A doping process according to claim 1, wherein the transitory annealing is performed in the solid phase.

6. A doping process according to claim 1, wherein the different steps of the process are carried out in the same enclosure in vacuo.

7. A doping process according to claim 3, wherein the rare gas ion beam is an argon ion beam.

8. A doping process according to claim 7, wherein the argon ion beam transports an energy of approximately 200 kiloelectron-volts and has an intensity of approximately 400 microamperes.

* * * * *